(12) United States Patent
Yamabe et al.

(10) Patent No.: US 10,888,035 B2
(45) Date of Patent: Jan. 5, 2021

(54) POWER CONVERSION DEVICE

(71) Applicant: Mitsubishi Electric Corporation, Tokyo (JP)

(72) Inventors: Shota Yamabe, Tokyo (JP); Shogo Miki, Tokyo (JP); Katsuhisa Kodama, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 7 days.

(21) Appl. No.: 16/321,539

(22) PCT Filed: Sep. 20, 2016

(86) PCT No.: PCT/JP2016/077668
§ 371 (c)(1),
(2) Date: Jan. 29, 2019

(87) PCT Pub. No.: WO2018/055668
PCT Pub. Date: Mar. 29, 2018

(65) Prior Publication Data
US 2019/0208672 A1    Jul. 4, 2019

(51) Int. Cl.
*H05K 7/20* (2006.01)
*H02M 7/48* (2007.01)

(52) U.S. Cl.
CPC .......... *H05K 7/20927* (2013.01); *H02M 7/48* (2013.01); *H05K 7/209* (2013.01); *H05K 7/20854* (2013.01); *H05K 7/20872* (2013.01)

(58) Field of Classification Search
CPC .............................. H05K 7/20927; H02M 7/48
See application file for complete search history.

(56) References Cited

U.S. PATENT DOCUMENTS

| 5,632,351 A | 5/1997 | Ishiyama |
| 2003/0067749 A1 | 4/2003 | Tamba et al. |

(Continued)

FOREIGN PATENT DOCUMENTS

| JP | 02-194595 A | 8/1990 |
| JP | 07-231672 A | 8/1995 |

(Continued)

OTHER PUBLICATIONS

International Search Report of PCT/JP2016/077668 dated Nov. 29, 2016 [PCT/ISA/210].

(Continued)

*Primary Examiner* — Mukundbhai G Patel
(74) *Attorney, Agent, or Firm* — Sughrue Mion, PLLC; Richard C. Turner (57) ABSTRACT

In a power conversion device, a casing main body has a component mounting surface, on which electrical components are mounted, and a refrigerant flow passage surface, which is a back side of the component mounting surface. The refrigerant flow passage surface has a refrigerant flow passage groove. The component mounting surface has a first facing portion, which faces a lid, a second facing portion, which is adjacent to the first facing portion, and faces the lid farther away from the lid than the first facing portion, and aside surface portion, which is formed between the first facing portion and the second facing portion. The refrigerant flow passage groove has a first flow passage portion located on back sides of the first facing portion and the side surface portion, and a second flow passage portion located on a back side of the second facing portion.

13 Claims, 4 Drawing Sheets

(56) References Cited

U.S. PATENT DOCUMENTS

2014/0096938 A1* 4/2014 Kojima .................... F28F 1/00
                                                    165/104.19
2015/0208556 A1* 7/2015 Kodama ................ H05K 7/209
                                                    363/123

FOREIGN PATENT DOCUMENTS

| JP | 2002-16199 A | 1/2002 |
| JP | 2006-191765 A | 7/2006 |
| JP | 2007-295639 A | 11/2007 |
| JP | 2011-029480 A | 2/2011 |
| JP | 2014-39022 A | 2/2014 |
| JP | 2014-79129 A | 5/2014 |
| JP | 2016-005315 A | 1/2016 |
| JP | 2016-082603 A | 5/2016 |
| WO | 00/16397 A1 | 3/2000 |
| WO | 2006/103721 A1 | 10/2006 |
| WO | 2012/152551 A1 | 11/2012 |

OTHER PUBLICATIONS

Communication dated Oct. 1, 2019, from the Japanese Patent Office in counterpart application No. 2018-540512.
Communication dated Sep. 27, 2019, from the European Patent Office in counterpart European Application No. 16916739.2.

* cited by examiner

POWER CONVERSION DEVICE

CROSS REFERENCE TO RELATED APPLICATIONS

This application is a National Stage of International Application No. PCT/JP2016/077668, filed Sep. 20, 2016.

TECHNICAL FIELD

The present invention relates to a power conversion device to be mounted on a motor vehicle, for example.

BACKGROUND ART

On a motor vehicle using a motor as a drive source as in an electric vehicle or a hybrid vehicle, for example, a plurality of power conversion devices are mounted. Examples of the power conversion devices include a charger configured to convert a commercial AC power source into a DC power source to charge a high-voltage battery, a DC/DC converter configured to convert the DC power source of the high-voltage battery into a voltage (for example, 12 V) of a battery for auxiliary devices, and an inverter configured to convert DC power from the battery into AC power to be supplied to the motor.

In recent years, for achievement of price reduction of the above-mentioned power conversion devices, improved fuel consumption of the motor vehicle as a result of weight reduction of the power conversion devices, and reduced mounting spaces for the power conversion devices in the motor vehicle, downsizing of the power conversion devices is considered.

Moreover, along with the downsizing of the power conversion devices, downsizing of electronic components to be mounted on the power conversion devices is advancing, and a heat generation density of the electronic components is increasing, with the result that a cooling device having a higher cooling capacity is being required.

In contrast, in a related-art power conversion device, a part of a wall portion of a case housing a reactor and a capacitor forms a flow passage forming wall portion. The flow passage forming wall portion forms a refrigerant flow passage having a shape that is concave from the outside to the inside of the case. A lid portion made of metal, which covers the refrigerant flow passage, is attached to the case. A plurality of cooling fins, which protrude inside the refrigerant flow passage, are formed on the flow passage forming wall portion and the lid portion (see Patent Literature 1, for example).

CITATION LIST

Patent Literature

[PTL 1] JP 2016-5315 A

SUMMARY OF INVENTION

Technical Problem

However, in the related-art power conversion device configured as described above, components are mounted on both sides of the refrigerant flow passage, with the result that members for connecting the components and spaces are required, and it is thus difficult to downsize the power conversion device. Moreover, with only one cooling surface, a heat dissipation area is small, and heat dissipation performance is low. Further, in a case of a large-size and high-heat-generating electronic component, for example, a reactor and a transformer, a heat conduction path is long and heat resistance is large in the vicinity of a top portion of the electronic component, which is away from the cooling surface, and hence cooling is difficult.

The present invention has been made to solve the above-mentioned problem, and therefore has an object to provide a power conversion device, which is capable of increasing cooling capacity while downsizing the power conversion device.

Solution to Problem

According to one embodiment of the present invention, there is provided a power conversion device including: a plurality of electrical components; and a casing including a casing main body, on which the plurality of electrical components are mounted, and a lid, which is attached to the casing main body, the casing main body having a component mounting surface, and a refrigerant flow passage surface, which is a back side of the component mounting surface, the plurality of electrical components being mounted on the component mounting surface, the refrigerant flow passage surface having a refrigerant flow passage groove formed therein, the casing main body having a groove cover, which covers the refrigerant flow passage groove, attached thereto, the component mounting surface having a first facing portion, which faces the lid, a second facing portion, which is adjacent to the first facing portion, and faces the lid farther away from the lid than the first facing portion, and aside surface portion, which is formed between the first facing portion and the second facing portion, the refrigerant flow passage groove having a first flow passage portion, which is located on back sides of the first facing portion and the side surface portion, and a second flow passage portion, which is located on a back side of the second facing portion.

Advantageous Effects of Invention

According to the power conversion device of one embodiment of the present invention, with the electrical components being mounted on the component mounting surface, and the refrigerant flow passage groove being formed in the refrigerant flow passage surface, which is the back side of the component mounting surface, the electrical components can be collected on one side of the refrigerant flow passage. Moreover, with the first flow passage portion being located on the back side of the side surface portion, and the second flow passage portion being located on the back side of the second facing portion, when the electrical components are mounted in the second facing portion, the electrical components mounted on the second facing portion can be cooled from the first and second flow passage portions. Therefore, the cooling capacity can be increased while downsizing the power conversion device.

DESCRIPTION OF EMBODIMENTS

Now, embodiments for carrying out the present invention are described referring to the drawings.

First Embodiment

Figure 1:
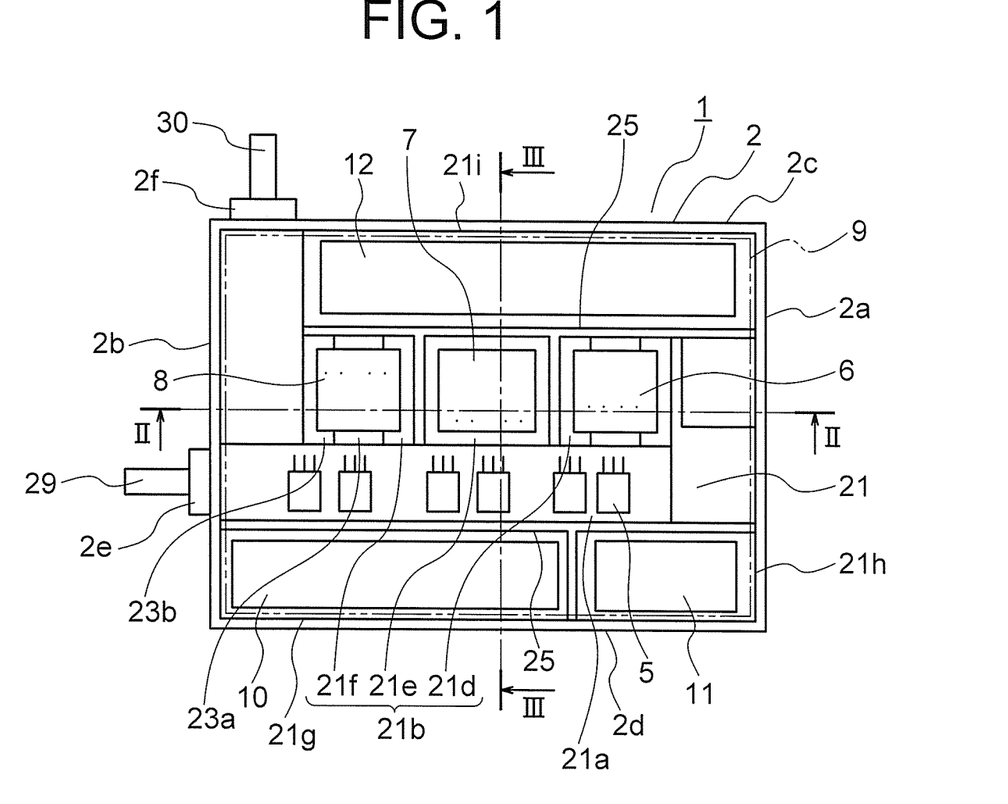
FIG. 1 is a plan view for illustrating an internal configuration of a power conversion device according to a first embodiment of the present invention.
Figure 2:
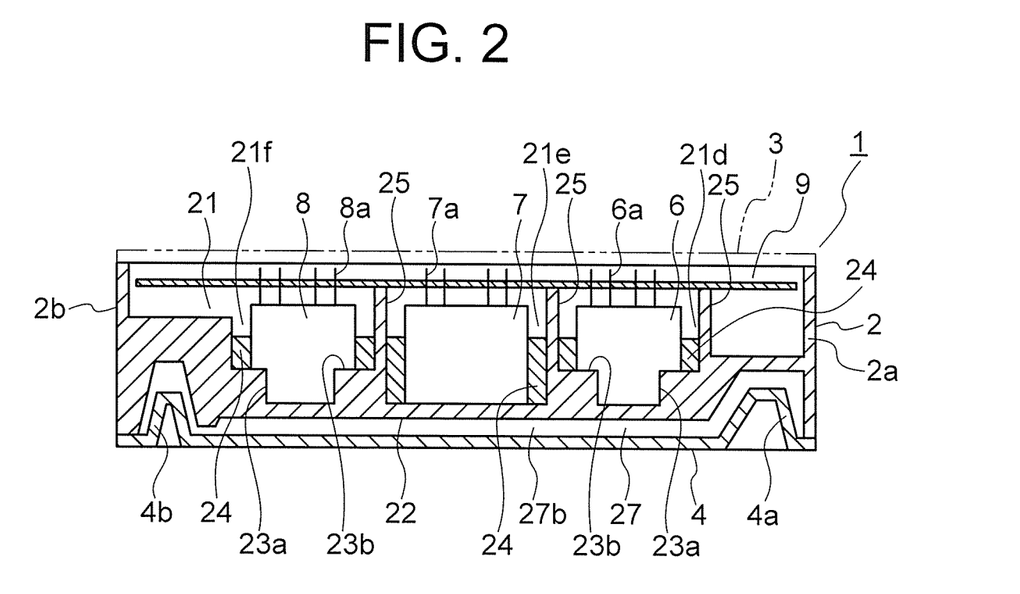
FIG. 2 is a cross-sectional view of the power conversion device taken along the line II-II of FIG. 1.
Figure 3:
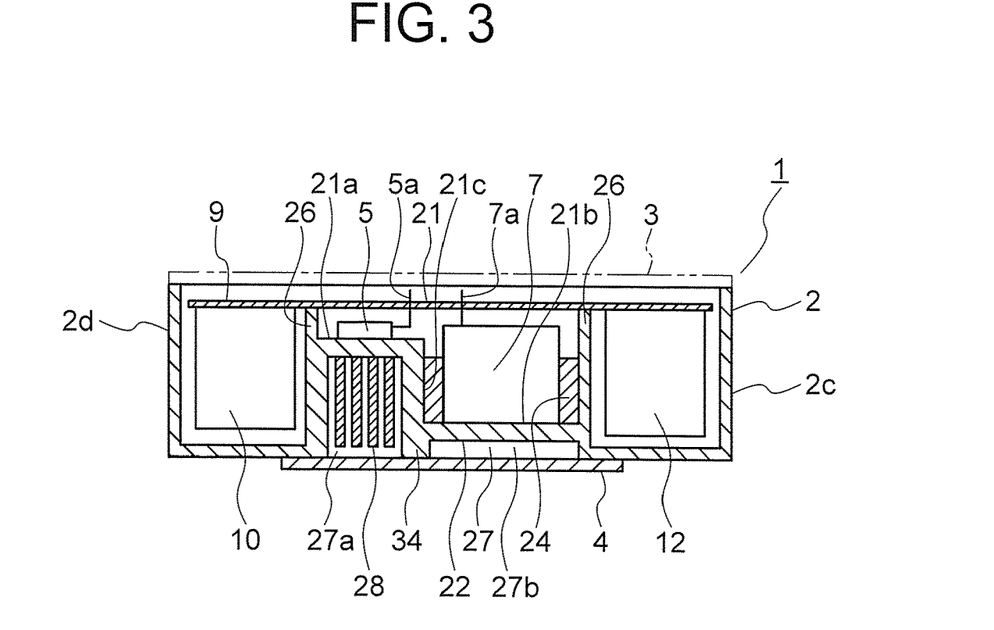
FIG. 3 is a cross-sectional view of the power conversion device taken along the line III-III of FIG. 1.

FIG. 1 is a plan view for illustrating an internal configuration of a power conversion device according to a first embodiment of the present invention, FIG. 2 is a cross-sectional view of the power conversion device taken along the line II-II of FIG. 1, and FIG. 3 is a cross-sectional view of the power conversion device taken along the line III-III of FIG. 1.

In FIG. 1 to FIG. 3, a casing 1 includes a casing main body 2, which is made of metal, a lid 3 having a flat plate shape, which is attached to one side of the casing main body 2, and a groove cover 4 having a flat plate shape, which is attached to the other side of the casing main body 2. In FIG. 1, the lid 3 is omitted in order to illustrate the inside of the casing 1, and in FIG. 2 and FIG. 3, the lid 3 is indicated by the two-dot chain line. Moreover, the power conversion device in the first embodiment is installed in an orientation in which the lid 3 is horizontal and is located at the top of the casing main body 2.

The casing main body 2 is formed of iron or aluminum, for example. Moreover, the casing main body 2 is a part integrally molded by casting. Further, around the casing main body 2, first and second side walls 2a and 2b, which face each other, and third and fourth side walls 2c and 2d, which face each other, are integrally formed.

On end surfaces of the first to fourth side walls 2a to 2d on one side of the casing main body 2, a sealant (not shown) is applied over the entire periphery. The lid 3 is bonded to the end surfaces of the first to fourth side walls 2a to 2d, that is, an open end of the casing main body 2 via the sealant, and is fixed to the casing main body 2 with a plurality of screws (not shown).

The casing main body 2 has a component mounting surface 21, which is a surface on the lid 3 side, and a refrigerant flow passage surface 22, which is a back side of the component mounting surface 21. The lid 3 is fixed to the casing main body 2 to seal the component mounting surface 21.

The component mounting surface 21 has a first facing portion 21a, which faces the lid 3, a second facing portion 21b, which is adjacent to the first facing portion 21a, and faces the lid 3 farther away from the lid 3 than the first facing portion 21a, and a side surface portion 21c, which is formed between the first facing portion 21a and the second facing portion 21b.

On the first facing portion 21a, a plurality of switching elements 5, which are high-heat-generating electrical components having a high heat generation density, are mounted at intervals. In this example, six switching elements 5 are used.

On the second facing portion 21b, a first reactor 6, a transformer 7, and a second reactor 8 are mounted. The first reactor 6, the transformer 7, and the second reactor 8 are high-heat-generating electrical components that generate a large amount of heat, and are magnetic material components.

In the second facing portion 21b, first to third rooms 21d, 21e, and 21f, which are partitioned from each other, are formed. The first reactor 6 is housed in the first room 21d. The transformer 7 is housed in the second room 21e. The second reactor 8 is housed in the third room 21f.

In each of the first and third rooms 21d and 21f, which are a part of the rooms, a concave portion 23a and a pair of convex portions 23b are formed to conform to a shape of each of the first and second reactors 6 and 8. Around each of the first reactor 6, the transformer 7, and the second reactor 8, a heat transfer material 24 (omitted in FIG. 1) is filled. As the heat transfer material 24, a resin material having high thermal conductivity as compared to a general resin material, for example, silicone resin, which is a potting material, is used.

The switching elements 5, the first reactor 6, the transformer 7, and the second reactor 8 are mounted with heights thereof being aligned, and respective terminals 5a, 6a, 7a, and 8a thereof are inserted in holes in a common substrate 9 (indicated by the two-dot chain line in FIG. 1) and electrically connected to the common substrate 9.

In a region outside the first and second facing portions 21a and 21b of the component mounting surface 21, fourth to sixth rooms 21g, 21h, and 21i are formed. In the fourth room 21g, a capacitor unit 10, which is a low-heat-generating electrical component that generates an amount of heat that is smaller than that generated by the high-heat-generating electrical components, is provided. In the fifth and sixth rooms 21h and 21i, first and second filter circuit units 11 and 12, which are low-heat-generating electrical components, are provided, respectively.

The capacitor unit 10, the first filter circuit unit 11, and the second filter circuit unit 12 are connected to the substrate 9. The substrate 9, and the electrical components 5, 6, 7, 8, 10, 11, and 12 connected to the substrate 9 form a power conversion circuit. In FIG. 2 and FIG. 3, illustration of internal configurations of the electrical components 5, 6, 7, 8, 10, and 12 is omitted.

In the first embodiment, the electrical components 6, 7, 8, 10, 11, and 12 having a plurality of types of projection areas, the projection areas being areas when projected orthogonally to a horizontal surface, are housed in the rooms 21d, 21e, 21f, 21g, 21h, and 21i having corresponding areas, respectively.

Clearance in each of the rooms 21d, 21e, 21f, 21g, 21h, and 21i is a minimum distance with which required insulation distance and mounting distance are secured.

The casing main body 2 has formed thereon a plurality of room partition walls 25 for partitioning the first to third rooms 21d, 21e, and 21f. The casing main body 2 also has formed thereon a plurality of heat partition walls 26 for partitioning the first and second facing portions 21a and 21b, on which the high-heat-generating electrical components are arranged, from the fourth to sixth rooms 21g, 21h, and 21i, in which the low-heat-generating electrical components are arranged. In the first embodiment, a third facing portion, which is provided in the region outside the heat partition walls 26, and faces the lid 3, is the fourth to sixth rooms 21g, 21*h*, and 21*i*. The substrate 9 is bonded to end surfaces of the room partition walls 25 and the heat partition walls 26 on the lid 3 side to be fixed to the casing main body 2.

In the refrigerant flow passage surface 22, a refrigerant flow passage groove 27 is formed. The groove cover 4 is formed of a steel plate, and covers the refrigerant flow passage groove 27. Moreover, the groove cover 4 is fixed to the casing main body 2 with a plurality of screws (not shown). Then, the refrigerant flow passage groove 27 and the groove cover 4 form a refrigerant flow passage. As refrigerant allowed to flow through the refrigerant flow passage, water or an ethylene glycol solution is used, for example.

As illustrated in FIG. 2, the groove cover 4 has formed thereon a plurality of drawing portions 4*a* and 4*b* along a cross-sectional shape orthogonal to a refrigerant flow in the refrigerant flow passage groove 27.

As illustrated in FIG. 3, the refrigerant flow passage groove 27 has a first flow passage portion 27*a*, which is located on back sides of the first facing portion 21*a* and the side surface portion 21*c*, and a second flow passage portion 27*b*, which is located on a back side of the second facing portion 21*b*.

In the first embodiment, the first flow passage portion 27*a* is arranged below the first facing portion 21*a* and to the side of a space above the second facing portion 21*b*. Moreover, the second flow passage portion 27*b* is arranged below the second facing portion 21*b*.

As a result, the switching elements 5 on the first facing portion 21*a* are cooled from below, and the first reactor 6, the transformer 7, and the second reactor 8 on the second facing portion 21*b* are cooled from the side and below. In other words, the first reactor 6, the transformer 7, and the second reactor 8 are cooled on two sides. Meanwhile, the refrigerant flow passage groove 27 is not arranged below the fourth to sixth rooms 21*g*, 21*h*, and 21*i*.

The first flow passage portion 27*a* has formed therein a plurality of cooling fins 28 along a refrigerant flow direction (direction orthogonal to the sheet surface of FIG. 3).

As illustrated in FIG. 3, when the casing 1 is placed such that the first and second facing portions 21*a* and 21*b* are horizontal, a width dimension (dimension in a left-and-right direction in FIG. 3) of a second flow passage cross section, which is a cross section orthogonal to the flow of the second flow passage portion 27*b*, is larger than a dimension in an up-and-down direction, that is, a dimension in a mounting direction of the electrical components of the second flow passage cross section. Moreover, a width dimension (dimension in the left-and-right direction in FIG. 3) of a first flow passage cross section, which is a cross section orthogonal to the flow of the first flow passage portion 27*a*, is smaller than the width dimension of the second flow passage cross section. Further, a dimension in the up-and-down direction of the first flow passage cross section is larger than the dimension in the up-and-down direction of the second flow passage cross section. Still further, the dimension in the up-and-down direction of the first flow passage cross section is larger than the width dimension of the first flow passage cross section.

As illustrated in FIG. 1, the second side wall 2*b* has formed thereon a first projecting portion 2*e*, which projects to the outside. In the first projecting portion 2*e*, a first pipe 29 made of metal for introducing the refrigerant into the refrigerant flow passage is fit. The third side wall 2*c* has formed thereon a second projecting portion 2*f*, which projects to the outside. In the second projecting portion 2*f*, a second pipe 30 made of metal for discharging the refrigerant from the refrigerant flow passage is fit. It should be noted, however, that the refrigerant may be introduced from the second pipe 30 and discharged from the first pipe 29.

The first and second pipes 29 and 30 are press-fitted in pipe holes (not shown) formed in the first and second projecting portions 2*e* and 2*f*, respectively. Around the periphery of each of portions press-fitted in the pipe holes of the first and second pipes 29 and 30, a sealant (not shown) is applied.

On the component mounting surface 21 side of the first side wall 2*a*, a connector (not shown) for inputting and outputting electric power from and to the outside is provided.

Figure 4:
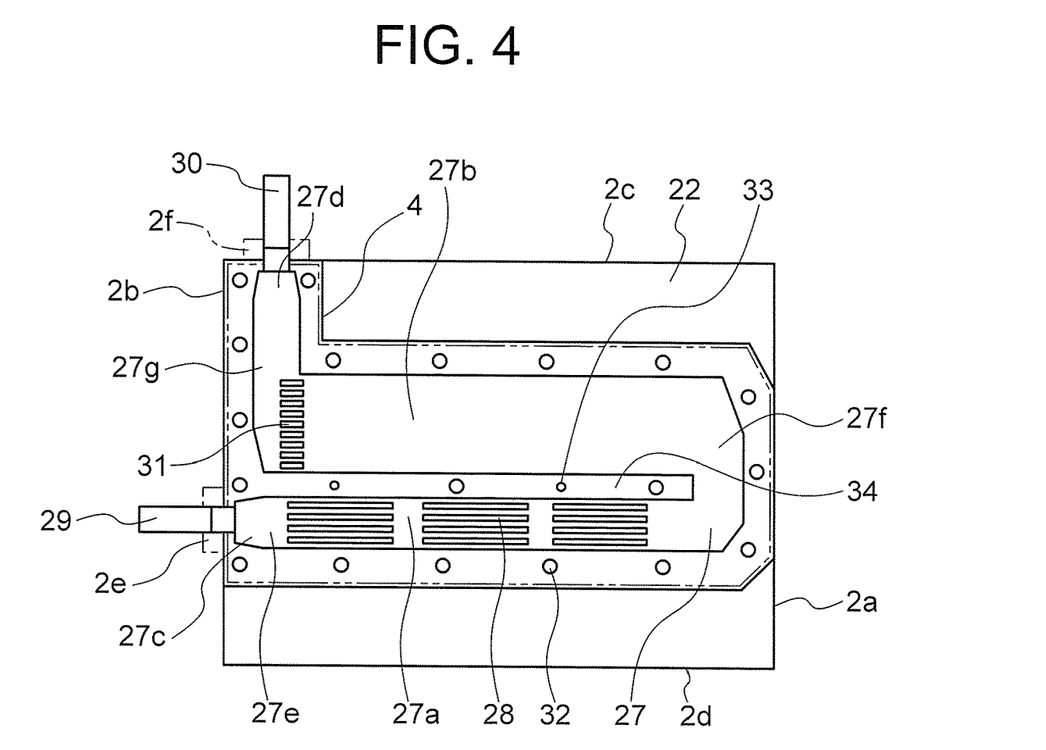
FIG. 4 is a plan view for illustrating a refrigerant flow passage groove and a groove cover of FIG. 2 and FIG. 3 in perspective from a component mounting surface side.

FIG. 4 is a plan view for illustrating the refrigerant flow passage groove 27 and the groove cover 4 in FIG. 2 and FIG. 3 in perspective from the component mounting surface 21 side. The cooling fins 28 are arranged with a gap therebetween in a width direction (up-and-down direction in FIG. 4) and the refrigerant flow direction (left-and-right direction in FIG. 4) of the first flow passage portion 27*a*.

The refrigerant flow passage groove 27 has, in addition to the first and second flow passage portions 27*a* and 27*b*, an inlet portion 27*c* for introducing the refrigerant from an outside of the casing 1 into the refrigerant flow passage groove 27, an outlet portion 27*d* for discharging the refrigerant to the outside of the casing 1, a first connecting portion 27*e* for connecting the inlet portion 27*c* and the first flow passage portion 27*a*, a second connecting portion 27*f* for connecting the first flow passage portion 27*a* and the second flow passage portion 27*b*, and a third connecting portion 27*g* for connecting the second flow passage portion 27*b* and the outlet portion 27*d*.

The inlet portion 27*c*, the first connecting portion 27*e*, the first flow passage portion 27*a*, the second connecting portion 27*f*, the second flow passage portion 27*b*, the third connecting portion 27*g*, and the outlet portion 27*d* are connected in series to one another to form one continuous refrigerant flow passage. The first flow passage portion 27*a* and the second flow passage portion 27*b* are parallel to each other, and the first flow passage portion 27*a*, the second connecting portion 27*f*, and the second flow passage portion 27*b* form a U-shaped flow passage.

In a part of the refrigerant flow passage groove 27, a plurality of rectifier fins 31 are formed. In the first embodiment, the rectifier fins 31 are formed in a portion between the second flow passage portion 27*b* and the third connecting portion 27*g*, at which the refrigerant flow direction is bent at a right angle. Between an upstream side and a downstream side of the rectifier fins 31, a cross-sectional area of the refrigerant flow passage groove 27 is changed.

In both edge portions of the refrigerant flow passage groove 27 in the refrigerant flow passage surface 22, a plurality of screw holes 32, into which the screws for fixing the groove cover 4 are screwed, are formed. Over the entire periphery of the refrigerant flow passage groove 27 on the refrigerant flow passage surface 22, a sealant (not shown) is applied to extend between the refrigerant flow passage groove 27 and the screw holes 32.

Between the first flow passage portion 27*a* and the second flow passage portion 27*b*, a refrigerant partition wall 34 is formed. The screw holes 32 are also formed in the refrigerant partition wall 34. Moreover, in the refrigerant partition wall 34, a pair of positioning holes 33 are formed. A pair of positioning projections (not shown) to be inserted in the positioning holes 33 are formed on the groove cover 4.

Cross-sectional areas orthogonal to the refrigerant flow of the inlet portion 27*c* and the outlet portion 27*d* are larger than cross-sectional areas orthogonal to the refrigerant flow of the first and second pipes 29 and 30, respectively. Ends of the first and second pipes 29 and 30 on the casing main body 2 side remain in the pipe holes, and do not protrude into the inlet portion 27c and the outlet portion 27d, respectively.

Moreover, the cross-sectional areas orthogonal to the refrigerant flow of the inlet portion 27c and the outlet portion 27d are gradually changed along the refrigerant flow direction. In other words, the cross-sectional areas are gradually increased from the sides of the first and second pipes 29 and 30 to the opposite sides. Corner portions of the refrigerant flow passage groove 27, at which the cross-sectional area is changed, are rounded such that the cross-sectional area is changed gently. Moreover, at slope portions of an inner wall of the refrigerant flow passage groove 27, the gradient is set to be as small as possible.

In the above-mentioned power conversion device, with the electrical components 5, 6, 7, 8, 10, 11, and 12 being mounted on the component mounting surface 21, and the refrigerant flow passage groove 27 being formed in the refrigerant flow passage surface 22, which is the back side of the component mounting surface 21, the electrical components 5, 6, 7, 8, 10, 11, and 12 can be collected on one side of the refrigerant flow passage. Moreover, with the first flow passage portion 27a being located on the back side of the side surface portion 21c, and the second flow passage portion 27b being located on the back side of the second facing portion 21b, the electrical components 6, 7, and 8, which are mounted on the second facing portion 21b, can be cooled from the first and second flow passage portions 27a and 27b. Therefore, cooling capacity can be increased while the power conversion device is downsized.

Further, with the electrical components 5, 6, 7, and 8 being collected on the component mounting surface 21, it is not required to rotate the casing 1 a number of times when the electrical components 5, 6, 7, and 8 are mounted, and assembly man-hours can thus be reduced.

Moreover, with the width dimension of the second flow passage cross section of the second flow passage portion 27b being larger than the dimension in the up-and-down direction, a cooling area for the electrical components 6, 7, and 8 mounted on the second facing portion 21b can be increased.

Further, with the width dimension of the first flow passage cross section of the first flow passage portion 27a being smaller than the width dimension of the second flow passage cross section, and with the dimension in the up-and-down direction of the first flow passage cross section being larger than the dimension in the up-and-down direction of the second flow passage cross section, the cooling area for the electrical components 6, 7, and 8 mounted on the second facing portion 21b can be increased. Moreover, the change in cross-sectional area of the refrigerant flow passage can be reduced, drift of a refrigerant flow rate can be suppressed, and the refrigerant flow rate can be equalized, with the result that highly efficient cooling can be performed without generating a bias in cooling performance.

Still further, the inlet portion 27c, the first flow passage portion 27a, the second flow passage portion 27b, and the outlet portion 27d of the refrigerant flow passage groove 27 are connected in series to one another via the connecting portions 27e, 27f, and 27g, with the result that members used for the connection can be reduced, and the power conversion device can be downsized and reduced in cost and weight.

Moreover, the cooling fins 28 are formed in the first flow passage portion 27a, and hence cooling capacity for the switching elements 5 mounted on the first facing portion 21a can be increased. Further, a substantial cross-sectional area of the first flow passage portion 27a is reduced by the cooling fins 28, with the result that the flow rate of the refrigerant can be increased and that a surface area with which the refrigerant is brought into contact can be increased. Thus, the cooling capacity for the switching elements 5 can be increased.

Further, the rectifier fins 31 are formed in the portion in which the refrigerant flow direction is bent and the cross-sectional area is changed, with the result that the flow of the refrigerant can be suppressed to equalize the refrigerant and that a change in flow passage cross-sectional area can be reduced to suppress the drift of the refrigerant flow rate and equalize the refrigerant flow rate. Thus, the highly efficient cooling can be performed without generating the bias in cooling performance.

Still further, with the first reactor 6, the transformer 7, and the second reactor 8 being mounted on the second facing portion 21b, the high-heat-generating electrical components can be cooled at high efficiency.

Moreover, with the heat transfer material 24 being filled around the first reactor 6, the transformer 7, and the second reactor 8, the high-heat-generating electrical components, which generate a large amount of heat, can be cooled at higher efficiency.

Further, with the switching elements 5 being mounted on the first facing portion 21a, the high-heat-generating electrical components having the high heat generation density can be cooled at even higher efficiency.

Still further, the switching elements 5, the first reactor 6, the transformer 7, and the second reactor 8 are mounted on the first and second facing portions 21a and 21b with heights thereof being aligned, and are connected to the common substrate 9, with the result that a circuit configuration is simplified and that a parts layout becomes easier. Thus, the power conversion device can be downsized and reduced in cost and weight.

Moreover, with the heat partition walls 26 being formed on the casing main body 2, heat transfer between the high-heat-generating components and the low-heat-generating components is suppressed, and temperatures of the low-heat-generating components become less likely to be affected by temperatures of the high-heat-generating components. As a result, a reduction in life of the low-heat-generating electrical components can be prevented. Moreover, inexpensive parts having low allowable temperatures can be selected as the low-heat-generating electrical components, and the cost can thus be reduced.

Further, with the substrate 9 being bonded to the end surfaces of the room partition walls 25, heat transfer among the first to third rooms 21d, 21e, and 21f can be suppressed.

Still further, with the substrate 9 being bonded to the end surfaces of the heat partition walls 26, heat transfer between the high-heat-generating components and the low-heat-generating components can be further suppressed.

Moreover, with the concave portion 23a and the convex portions 23b being formed in each of the first and third rooms 21d and 21f to conform to the shape of each of the first and second reactors 6 and 8, heat transfer paths of the first and second reactors 6 and 8 can be reduced, and heat dissipation performance and mounting performance can be increased.

Further, with the clearance in each of the rooms 21d, 21e, 21f, 21g, 21h, and 21i being the minimum distance with which the required insulation distance and mounting distance are secured, the power conversion device can be downsized and reduced in cost and weight.

Still further, with the refrigerant flow passage groove 27 and the rooms 21d, 21e, 21f, 21g, 21h, and 21i being formed such that the heights of the electrical components 5, 6, 7, 8, 10, 11, and 12 are aligned, an unnecessary space between each of the electrical components 5, 6, 7, 8, 10, 11, and 12 and the substrate 9 can be reduced, and the power conversion device can thus be downsized.

Moreover, with the heights of the electrical components 5, 6, 7, and 8 being aligned, the terminals 5a, 6a, 7a, and 8a can be directly inserted into the holes of the substrate 9, and it is not required to provide an additional part for the connection between each of the electrical components 5, 6, 7, and 8 and the substrate 9, with the result that the power conversion device can be downsized and reduced in cost and weight.

Further, with the ends of the first and second pipes 29 and 30 on the casing main body 2 side remaining in the pipe holes, and with the cross-sectional areas orthogonal to the refrigerant flow of the inlet portion 27c and the outlet portion 27d being larger than the cross-sectional areas orthogonal to the refrigerant flow of the first and second pipes 29 and 30, respectively, an increase in pressure loss caused by the projection of the pipes can be prevented, and the drift of the refrigerant flow rate can be suppressed and equalized, with the result that the highly efficient cooling can be performed without generating the bias in cooling performance.

Still further, with the first and second flow passage portions 27a and 27b being connected in series to each other and arranged in parallel to each other, and with the inlet portion 27c and the outlet portion 27d being the only portions in which the change in cross-sectional area is large, the change in flow passage cross-sectional area can be reduced, and the drift of the refrigerant flow rate can be suppressed and equalized. Thus, the highly efficient cooling can be performed without generating the bias in cooling performance.

Moreover, with the screw holes 32 being provided also in the refrigerant partition wall 34 between the first flow passage portion 27a and the second flow passage portion 27b, and with the screws for fixing the groove cover 4 being arranged in the screw holes 32, the refrigerant can be reliably prevented from flowing directly from the first flow passage portion 27a to the second flow passage portion 27b, and the drift of the refrigerant can be prevented from being generated. Moreover, deformation of the groove cover 4 caused by the pressure of the refrigerant can be prevented.

Further, with the electrical components 6, 7, 8, 10, 11, and 12 being housed in the rooms 21d, 21e, 21f, 21g, 21h, and 21i, respectively, effects of noise generated by one another can be reduced.

Still further, with the drawing portions 4a and 4b being formed on the groove cover 4 to conform to the shape of the refrigerant flow passage groove 27, the refrigerant can be rectified. Moreover, the change in refrigerant flow passage cross-sectional area can be suppressed, and a vortex, stagnation, or other drift of the refrigerant can be suppressed. Thus, a pressure loss of the refrigerant can be reduced.

Examples of the above-mentioned sealant include an O-ring seal or a gasket.

Moreover, the casing main body 2 is not limited to the integrally molded part made of metal, and may be a resin-molded article made of a resin having high thermal conductivity, or a resin-molded article with metal partially inserted therein, for example.

Further, the material of the groove cover 4 is not limited to the steel plate, and may be a resin-molded article with metal partially inserted therein, for example.

Still further, the casing main body 2 and the groove cover 4 may be produced by forging or extruding.

Moreover, the first and second pipes 29 and 30 are not limited to metal pipes, and may each be a resin-molded article with metal partially inserted therein, for example.

Further, the method of connecting the first and second pipes 29 and 30 to the casing main body 2 is not limited to press fitting, and may be friction stir welding, welding, brazing, caulking, or fixing with screws, for example.

Still further, in the above-mentioned example, fixing portions for the first and second pipes 29 and 30 are formed in the casing main body 2, but may be formed in the groove cover 4. In other words, the first and second pipes 29 and 30 may be fixed to the groove cover 4.

Moreover, the cooling fins 28 or the rectifier fins 31 may be formed all over the refrigerant flow passage groove 27.

Further, the cooling fins 28 may be formed continuously in the refrigerant flow direction, or may be formed discontinuously to be interrupted in the refrigerant flow direction so as to provide a leading edge effect.

Still further, the cooling fins 28 and the rectifier fins 31 may be formed on the groove cover 4.

Moreover, the cooling fins 28 and the rectifier fins 31 may be formed integrally with the casing main body 2 or the groove cover 4, or may be attached to the casing main body 2 or the groove cover 4 as separate parts.

Further, the cooling fins 28 may be pin fins or offset fins.

Still further, in the above-mentioned example, only one refrigerant flow passage is illustrated. However, a plurality of refrigerant flow passages may be formed in the casing main body 2, or one refrigerant flow passage may be branched into a plurality of flow passages at some midpoint.

Moreover, in the above-mentioned example, the first pipe 29 is arranged in the second side wall 2b, and the third side wall 2c is arranged in the second pipe 30. However, the first and second pipes 29 and 30 may be arranged in any of the first to fourth side walls 2a to 2d.

Figure 5:
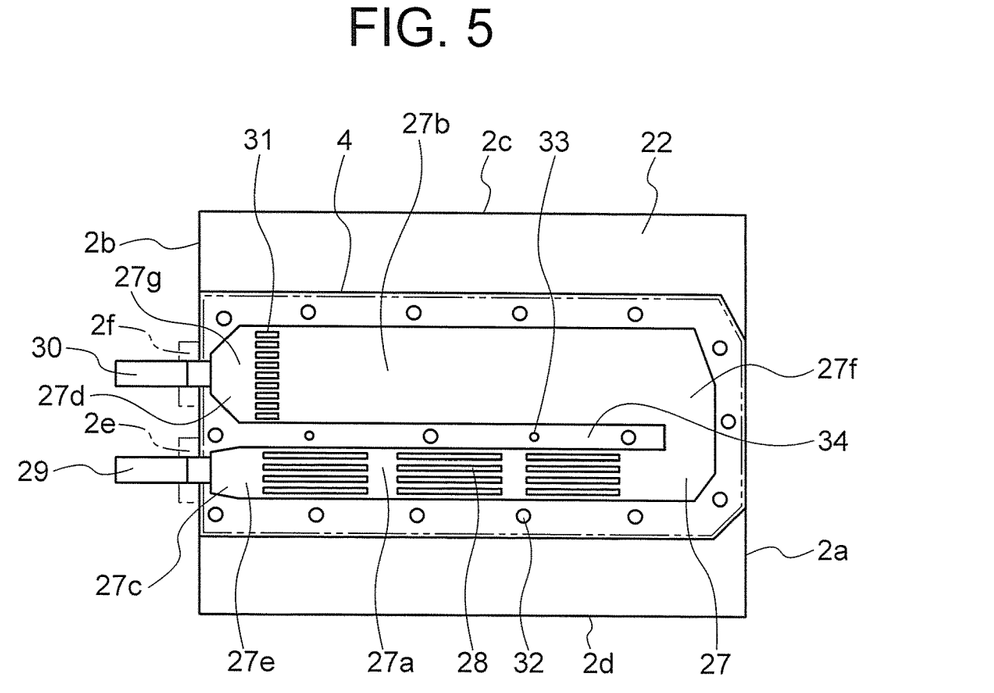
FIG. 5 is a plan view for illustrating a modification example in which a second pipe of FIG. 4 is arranged in a second side wall.
Figure 6:
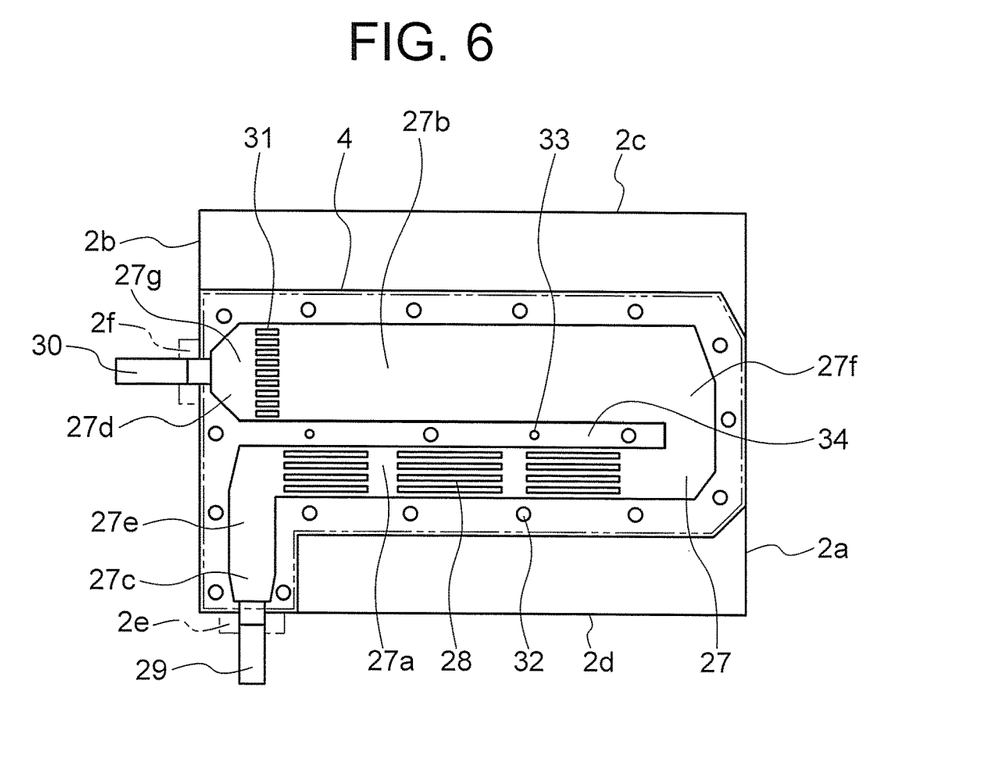
FIG. 6 is a plan view for illustrating a modification example in which a first pipe of FIG. 4 is arranged in a fourth side wall, and the second pipe is arranged in the second side wall.
Figure 7:
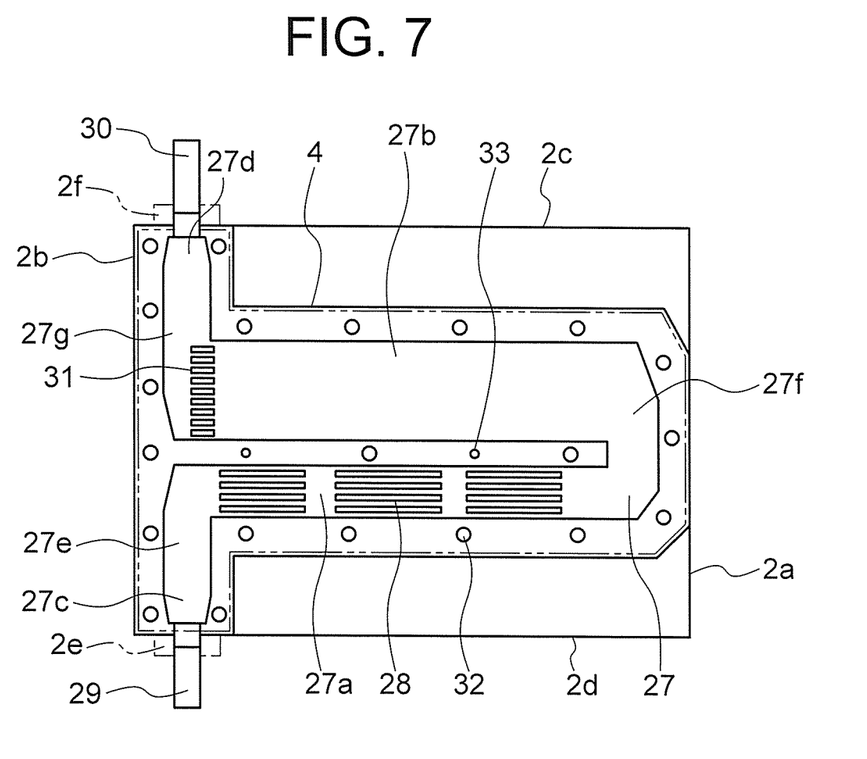
FIG. 7 is a plan view for illustrating a modification example in which the first pipe of FIG. 4 is arranged in the fourth side wall.

For example, FIG. 5 is a modification example in which the second pipe 30 of FIG. 4 is arranged in the second side wall 2b. Moreover, FIG. 6 is a modification example in which the first pipe 29 of FIG. 4 is arranged in the fourth side wall 2d, and the second pipe 30 is arranged in the second side wall 2b. Further, FIG. 7 is a modification example in which the first pipe 29 of FIG. 4 is arranged in the fourth side wall 2d.

Further, in the above-mentioned example, the casing 1 is installed such that the lid 3 is located at the top, but the orientation of the casing 1 is not limited thereto.

Still further, the combination of the electrical components to be mounted on the component mounting surface is not limited to the above-mentioned combination.

Moreover, the application of the power conversion device according to the present invention is not limited to a motor vehicle.

The invention claimed is:

1. A power conversion device, comprising:
a plurality of electrical components; and
a casing including a casing main body and a lid attached to the casing main body,
the casing main body comprising:
a component mounting surface,
a refrigerant flow passage surface, which is a back side of the component mounting surface and comprises a refrigerant flow passage groove formed therein, and
a groove cover, which covers the refrigerant flow passage groove, wherein the component mounting surface comprises:
a first facing portion, which faces the lid and has a first electrical component mounted thereto among the plurality of electrical components,
a second facing portion, which is adjacent to the first facing portion, faces the lid farther away from the lid than the first facing portion, and has a second electrical component mounted thereto among the plurality of electrical components, and
a side surface portion, which is formed between the first facing portion and the second facing portion,
wherein the refrigerant flow passage groove comprises:
a first flow passage portion, which is located on back sides of the first facing portion and the side surface portion, respectively, so that a refrigerant is configured to flow in the refrigerant flow passage groove underneath the first electrical component mounted on the first facing portion and at a side of the second electrical component mounted on the second facing portion, and
a second flow passage portion, which is located on a back side of the second facing portion, so that the refrigerant is configured to flow in the refrigerant flow passage groove underneath the second electrical component mounted on the second facing portion.

2. The power conversion device according to claim 1, wherein, when the casing is positioned so that the first facing portion and the second facing portion are horizontal,
the second flow passage portion has a second flow passage cross section, which is a cross section orthogonal to a flow of the second flow passage portion, the second flow passage cross section having a width dimension that is larger than a dimension in an up-and-down direction thereof,
the first flow passage portion has a first flow passage cross section, which is a cross section orthogonal to a flow of the first flow passage portion, the first flow passage portion having a width dimension that is smaller than the width dimension of the second flow passage cross section, and
the first flow passage cross section has a dimension in the up-and-down direction that is larger than the dimension in the up-and-down direction of the second flow passage cross section.

3. The power conversion device according to claim 2, wherein the refrigerant flow passage groove further has an inlet portion for introducing the refrigerant from an outside of the casing into the refrigerant flow passage groove, and an outlet portion for discharging the refrigerant to the outside of the casing, and
wherein the first flow passage portion, the second flow passage portion, the inlet portion, and the outlet portion are connected in series to one another.

4. The power conversion device according to claim 1, further comprising a rectifier fin at a portion at which a refrigerant flow direction in the refrigerant flow passage groove is bent,
wherein the refrigerant flow passage groove has a cross-sectional area that is changed between an upstream side and a downstream side of the rectifier fin.

5. The power conversion device according to claim 1, wherein the second electrical component includes a magnetic material component mounted on the second facing portion.

6. The power conversion device according to claim 5, wherein the magnetic material component includes a transformer and a reactor.

7. The power conversion device according to claim 5, further comprising a heat transfer material, which is filled around the magnetic material component.

8. The power conversion device according to claim 1, wherein the first electrical component mounted on the first facing portion includes a switching element.

9. The power conversion device according to claim 1, wherein at least some of the plurality of electrical components are mounted on the first facing portion and the second facing portion with heights thereof being aligned, and are connected to a common substrate.

10. The power conversion device according to claim 1, wherein the casing main body has formed thereon a heat partition wall for partitioning the first facing portion and the second facing portion from a region outside the first facing portion and the second facing portion.

11. The power conversion device according to claim 10, wherein the component mounting surface further includes a third facing portion, which is provided in the region outside the heat partition wall on the component mounting surface, and faces the lid.

12. The power conversion device according to claim 11, wherein the plurality of electrical components include a low-heat-generating electrical component mounted on the third facing portion.

13. The power conversion device according to claim 12, wherein the low-heat-generating electrical component includes at least one of a capacitor unit and a filter circuit unit.

* * * * *